United States Patent [19]

Kleinberg

[11] 4,437,069

[45] Mar. 13, 1984

[54] LOW NOISE TUNED AMPLIFIER

[75] Inventor: Leonard L. Kleinberg, Greenbelt, Md.

[73] Assignee: The United States of America as represented by the Administrator, National Aeronautics and Space Administration, Washington, D.C.

[21] Appl. No.: 272,839

[22] Filed: Jun. 12, 1981

[51] Int. Cl.³ .............................................. H03F 1/34
[52] U.S. Cl. .................................... 330/109; 330/277; 330/294
[58] Field of Search ............... 330/107, 109, 277, 294; 331/110, 141

[56] References Cited

U.S. PATENT DOCUMENTS 3,405,368 10/1968 Howe ............................... 330/109 X
3,597,696 8/1971 Rabindran ............................. 330/10
3,967,209 6/1976 Skoures et al. ........................ 330/86

OTHER PUBLICATIONS

Anderson et al., "A Low Noise Amplifier with Application to Noise Thermometry Between 300 and 4k", Review of Scientific Instruments, vol. 45, No. 1, Jan. 1974, pp. 42-44.

Smith, "Transistor R-C Oscillators and Selective Amplifiers", Wireless World, Apr. 1963, pp. 183-185.

Primary Examiner—James B. Mullins
Attorney, Agent, or Firm—John O. Tresansky; John R. Manning; Ronald F. Sandler

[57] ABSTRACT

A bandpass amplifier employing a field effect transistor amplifier first stage (10) with a resistive load ($R_2$) either a.c. or directly coupled to the non-inverting input of an operational amplifier second stage (20) which is loaded in a Wien Bridge configuration. The bandpass amplifier may be operated with a signal injected into the gate terminal (G) of the field effect transistor and the signal output taken from the output terminal of the operational amplifier. The operational amplifier stage appears as an inductive reactance, capacitive reactance and negative resistance at the non-inverting input of the operational amplifier, all of which appear in parallel with the resistive load ($R_2$) of the field effect transistor.

10 Claims, 1 Drawing Figure

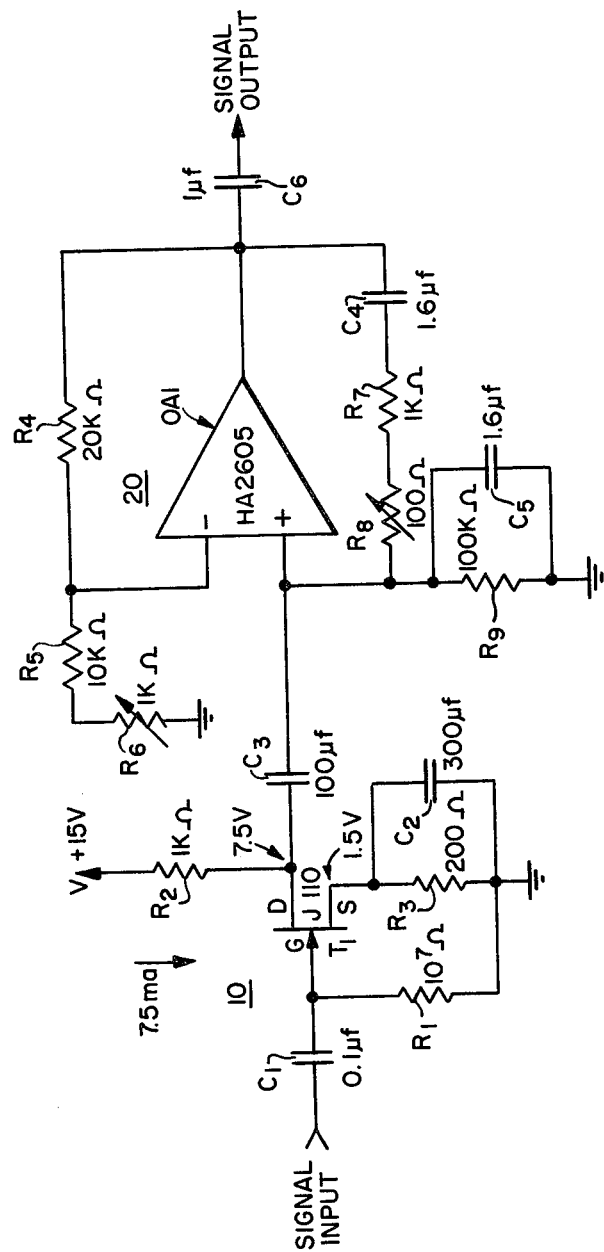

LOW NOISE TUNED AMPLIFIER

ORIGIN OF THE INVENTION

The invention described herein was made by an employee of the United States Government and may be manufactured and used by or for the Government of the United States of America or for governmental purposes without the payment of any royalties thereon or therefor.

TECHNICAL FIELD

The invention relates to circuitry which may function as an amplifier and more particularly, to amplifiers which are tuned.

BACKGROUND ART

Amplifiers with low input noise and high input impedance are desired in certain applications, such as where the input signal is derived from a high impedance source with a low level signal output. Examples are instruments where an input signal is generated by an infrared sensor such as a bolometer or photovoltaic cell. In such cases, it has been customary to employ a lock-in amplifier comprised of a tuned pre-amplifier followed by a phase sensitive detector with a low-pass filter. Typically, great care has been required with the pre-amplifier design.

The use of bipolar transistors as the active component of the first stage of such an amplifier has not always proved satisfactory because the input impedance would be too low and/or because its current noise would be too high. Where a field effect transistor (FET) was substituted for the bipolar transistor in the first stage of the amplifier, the input impedance no longer presented a problem because the input impedance of the device was inherently high but other problems remained. The state-of-the-art in sensor amplifiers includes an amplifier with a FET first stage driving a second stage which is often an operational amplifier. However, to obtain a low noise characteristic from the first stage, a large drain to source current is required which necessitates the use of a small load resistor. This, in turn, results in a low first stage gain which allows a significant portion of noise from the second stage to effectively appear at the input to the first stage. This undesirable characteristic can be avoided by employing a low noise second stage operational amplifier; however, these devices are very expensive. The prior art, therefore, does not provide an inexpensive, low noise amplifier with a high input impedance characteristic.

STATEMENT OF INVENTION

Accordingly, it is an object of the present invention to provide an inexpensive, low noise, high input impedance tuned amplifier.

Another object is to provide an amplifier suitable for use with sensors having low output signal levels.

A further object is to provide an amplifier suitable for use with sensors having high output impedance characteristics.

Yet another object is to provide an amplifier suitable for functioning as a preamplifier for a lock-in amplifier.

According to the invention, these and other objects are attained by a tuned, two stage amplifier, the first stage of which utilizes a FET amplifier driving the non-inverting input of an operational amplifier loaded in a reactive impedance configuration, such as a Wien Bridge.

BRIEF DESCRIPTION OF THE DRAWING

The invention will be more readily appreciated when considered with the accompanying solitary FIGURE wherein a schematic diagram for a two stage amplifier is shown.

DETAILED DESCRIPTION OF THE INVENTION

Referring to the FIGURE, the amplifier of this invention is shown as having a first amplifier stage 10 coupled to and driving an operational amplifier second stage 20. The first stage includes a field effect transistor $T_1$, which may be a JFET No. J110. A coupling capacitor $C_1$ is connected to the gate terminal G of transistor $T_1$ for applying an input signal to the amplifier. The only requirement of the capacitor, in terms of size, is that it be large enough to prevent appreciable signal loss thereacross throughout the frequency band of operation with a given signal source output impedance. The gate G is also connected to ground through a leakage resistor $R_1$ which, in essence, determines the input impedance of the circuit. Essentially no current flows from the gate to ground, i.e., the gate operates at about ground potential. A power supply V is connected to the drain connection D of $T_1$ through a resistor $R_2$ while a resistor $R_3$ is connected between the source connection S of $T_1$ and ground. Resistors $R_2$ and $R_3$ establish the d.c. load line for field effect transistor $T_1$. The drain may be operated about a center biased position. A bypass capacitor $C_2$ is connected across resistor $R_3$ to effectively remove resistor $R_3$ as part of the a.c. load line. The required value of $C_2$ is understood to be dependent on the frequency of operation, i.e., it must present an impedance value that is small compared to $R_3$ throughout the operational frequency band. It must, additionally, be small compared to $1/gm$, which establishes the input impedance for the stage, to block the d.c., but not affect the a.c. impedance. If affected, it would reduce the gain and produce a phase shift. The output signal from the first amplifier stage 10 is taken from the drain connection D of $T_1$ and may be a.c. coupled through a capacitor $C_3$. The first amplifier stage 10, designed with a relatively small in magnitude load resistor $R_2$ yields a gain in the range of about 7 to 10 and displays an essentially flat frequency response when not additionally loaded with the second stage 20. For an effective instrument preamplifier the requirement for overall voltage gain where the second amplifier stage 20 may be noisy, however, is about from 50 to 100.

The signal from the first stage 10 is applied to the non-inverting input of an operational amplifier OA1 which may be an HA2605, manufactured by the Harris Corporation. For the purposes of this disclosure, an operational amplifier is considered to be an amplifier with an inverting input, a non-inverting input, a very high input impedance, very low output impedance and very high gain. The operational amplifier OA1 is loaded with resistors $R_4$ through $R_9$ and capacitors $C_4$ and $C_5$. This particular load is in the form of a reactance impedance configuration, such as a Wien Bridge. One arm of the bridge is comprised of resistors $R_5$ and $R_6$, another arm is comprised of resistor $R_4$, a third arm of resistors $R_7$ and $R_8$ and capacitor $C_4$ and the fourth arm is comprised of resistor $R_9$ and capacitor $C_5$. Resistor $R_4$ is connected between the output and the inverting input of operational amplifier OA1. Resistor $R_5$ is connected at one end to the junction of $R_4$ and the inverting input of OA1 and, at the other end, to one side of a potentiometer $R_6$. The other side of potentiometer $R_6$ is grounded. The output of the operational amplifier OA1 is also connected to the non-inverting input of the operational amplifier by a series network consisting of capacitor $C_4$, resistor $R_7$ and a potentiometer $R_8$. The non-inverting input also has a parallel network consisting of capacitor $C_5$ in parallel with resistor $R_9$, both of which are connected between itself and its connection with resistor $R_8$, and ground. Both the inverting and non-inverting inputs of the operational amplifier may be operated essentially at zero potential. The output of the operational amplifier is connected to a utilization circuit or device (not shown) through a coupling capacitor $C_6$.

The overall operation of the amplifier in terms of center frequency, Q, and gain can be varied by changing the values of the Wien Bridge components. Fine tuning in terms of Q, gain and center bandpass frequency may be accomplished by varying the adjustable resistance magnitudes of potentiometers $R_6$ and $R_8$ of the Wien Bridge. To help understand how these circuit characteristics may be predictably changed, an analysis follows of the characteristics of the operational amplifier, loaded in a Wien Bridge configuration. The voltage gain K between the non-inverting input and the output of the operational amplifier, ignoring $R_6$, may be expressed as:

$$k = 1 + R_4/R_5$$

This expression may be further simplified to read: $k = 1 + k'$ where $k' = R_4/R_5$.

A simplified expression for the input admittance, looking into the non-inverting terminal of OA1, may be:

$$Y_{in} = \frac{-k}{R_7 - JX_{c4}} \times \frac{R_7 + JX_{c4}}{R_7 + JX_{c4}}$$

$$= \frac{-kR_7}{R_7^2 + X_{c4}^2} - \frac{kJX_{c4}}{R_7^2 + X_{c4}^2}$$

A determination of the input admittance is important because it indicates the circuit characteristics in terms of such factors as gain, Q and resonant frequency. The total admittance, as seen from the drain terminal of the first stage field effect transistor $T_1$, is determined by considering the load resistor $R_2$ and the shunt load impedance due to the reactance of $C_5$ along with the admittance as determined above looking into the non-inverting input of OA1. The resistance due to $R_9$ is not considered in the determination of the admittance because the magnitude thereof is very large. The total admittance can then be expressed as:

$$Y_{tot.} = \left(\frac{1}{R_2} - \frac{k'R_7}{R_7^2 + X_{c4}^2}\right) + J\left(\omega C_5 - \frac{k'X_{c4}}{R_7^2 + X_{c4}^2}\right)$$

where $\omega = 2\pi f$.

At resonance, by definition, the coefficients of the J term reduce to zero. Therefore, the imaginary portion of the total input admittance, at resonance, can be expressed as:

$$\omega C_5 = \frac{k'X_{c4}}{R_7^2 + X_{c4}^2}$$

If $C_5$ is made equal to $C_4$ as a design requirement, then $C_4 = C_5$, which can be made equal to C for the purpose of the following analysis. The above expression for $\omega C_5$ can then become:

$$\omega C = \frac{k'}{\omega C\left(R_7^2 + \frac{1}{\omega^2 C^2}\right)}$$

which may be further reduced to:

$$\omega^2 = \frac{k' - 1}{C^2 R_7^2} \text{ or, } \omega^2,$$

at resonance, is $$\omega_{res} = \frac{(k' - 1)^{\frac{1}{2}}}{CR_7}$$

because $\omega_{res} = 2\pi f_{res}$, $$f_{res} = \frac{(k' - 1)^{\frac{1}{2}}}{2\pi CR_7}$$

In a particular embodiment of the invention having the specific circuit parameters identified in the drawing, the resonant frequency of the amplifier is approximately 100 Hz. If $R_2$ is made equal to $R_7$ as a further design requirement, they can be made equal to R for analysis purposes. The real portion of the total input admittance may then be expressed as:

$$Y_{rl.} = \frac{1}{R} - \frac{k'R}{R^2 + \frac{1}{\omega^2 C^2}},$$

which can be reduced to $$Y_{rl.} = \frac{2 - k'}{R}$$

It is important to analyze the real portion of the input admittance because this determines the effective load impedance of the field effect transistor which, in turn, establishes the gain. For a gain improvement factor of 10, i.e., where the gain of the overall (pre) amplifier is ten times greater than the gain of the field effect transistor first stage 10 unloaded, an effective increase of the resistive load by a factor of 10 is desired. Therefore, $$y_{rl.} = \frac{1}{10 R} = \frac{2 - k'}{R}; k' = 1.9$$

This indicates that if the gain of the first stage, without feedback, is $G_m R_L$, or $G_m R_2$, the gain can be improved by a factor of 10, with feedback, if the ratio of $R_4$ to $R_5$, again ignoring $R_6$, is 1.9. This is accomplished by making the ratio of $R_4$ to $R_5$ equal to 2 and then reducing the ratio by varying potentiometer $R_6$ to a value that will reduce the ratio of $R_4$ to $R_5$, with $R_6$, to 1.9. The overall gain of the (pre) amplifier will be $G_mR$ x gain improvement factor, where the gain improvement factor is a function of the $R_4$, $R_5$ ratio. As $R_6$ is reduced in value, the $R_4$, $R_5$ ratio ($k'$) approaches 2 and the gain improvement factor will increase. Typically, $G_mR$ will have a value approximately equal to 8. If the gain improvement factor is 10, then the overall amplifier gain will be equal to 80.

The Q of the (pre) amplifier is given by:

$$Q = \frac{\omega C}{Y_{rL}} = \frac{\omega RC}{2 - k'}$$

From the equation the resonent frequency $$\omega RC = (k' - 1)^{\frac{1}{2}},$$

$$Q = \frac{(k' - 1)^{\frac{1}{2}}}{(2 - k')} \approx \frac{1}{2 - k'}$$

If $k'$ is 2, the network will oscillate. The potentiometer $R_6$ is used to make the ratio less than 2. For a Q of 10, $k'$, including the value of $R_6$ with $R_5$, must be approximately 1.9.

In actual practice, changes or adjustments in the design parameters are made in the following manner. Changes in the center bandpass or resonant frequency can be made by changing the magnitude of $R_2$ and $R_7$ equally. A change in $R_5$ will change the circuit Q. A change in $R_6$ will change both the Q and the gain improvement factor. After varying $R_6$, $R_8$ can be varied to readjust to the desired center bandpass frequency.

For the above described amplifier to operate satisfactorily as a preamplifier for a very low level signal from a high impedance source, overall low voltage noise is a primary consideration. To achieve this result the first stage itself must not only operate with low voltage noise, but it must have a voltage gain that is sufficiently high to effectively overcome the voltage noise contribution of the second stage to the effective input voltage noise as seen at the input to the first stage. This is because the rms noise that appears at the input is equal to the square root of the sum of the rms input noise contributed by the first stage squared, plus the rms noise of the second stage divided by the voltage gain of the first stage, squared. Accordingly, the voltage noise for a two stage amplifier may be expressed as:

$$(E_{NI})^2 = (E_{NI1})^2 + (E_{NI2}/k_1)^2$$

wherein:
$E_{NI}$ = total input voltage noise at the front end;
$E_{NI1}$ = input voltage noise at the front end attributable to the first stage;
$E_{NI2}$ = input voltage noise of the second stage; and
$k_1$ = voltage gain of the first stage without feedback from the second stage.

Consideration of the given relationship clearly indicates that the effect of the second stage noise on the amplifier front end can be effectively eliminated by making the first stage gain very high which is an attribute of the instant invention.

Ordinarily, a small load resistor is required for the first stage to establish a high DC current to keep the voltage noise contributed by the first stage low. The small load resistor, however, inherently implies a low gain because, as previously discussed, the gain for the stage is generally given as $G_mR_L$, i.e., the transconductance of the active device times the magnitude of the load resistance. In the past, it has proved difficult to achieve a low voltage noise first stage amplifier and at the same time, avoid reflection of a substantial amount of the second stage noise at the input. The invention teaches a circuit approach in which the seemingly mutually exclusive requirements need not be compromised. This is achieved because the invention allows the first stage's physical load resistance to be low in magnitude and thereby establish a large quiescent current and low voltage noise but also allows the use of a second stage providing a negative resistance which is larger than the load (drain) resistance of the first stage and which is reflected as part of, and in parallel with, the load resistance of the first stage. The first stage, therefore, can operate with both high quiescent current and high gain. The second stage also reflects an inductance and a capacitance, also in parallel with the first stage load resistance, which give the overall circuit a tuned characteristic. The magnitudes of the reactances are frequency dependent with the frequency of interest being the resonant frequency for the particular circuit. At resonance, the inductive and capacitive reactances cancel and form a bandpass characteristic centered around the resonant frequency. To provide an impedance which appears as an inductive reactance, capacitive reactance and negative resistance, at resonance, the non-inverting input of an operational amplifier is connected in a Wien Bridge configuration.

The typical voltage noise characteristic of the overall (pre) amplifier of the invention may be approximated for the disclosed circuit as follows. The input voltage noise at the front end attributable to the first stage ($E_{NI1}$) is typically about 5 nv. The input voltage noise of the second stage ($E_{NI2}$) for an inexpensive operational amplifier is typically about 40 nv. The voltage gain of the first stage without feedback from the second stage (k) when operated in the low noise (high current) mode is typically about 8 as previously given:

$$(E_{NI})^2 = (E_{NI1})^2 + (E_{NI2}/k_1)^2$$

$$= (5nv)^2 + (40\ nv/8)^2$$

$$E_{NI} \cong 7\ nv$$

Accordingly, it has been shown that the (pre) amplifier of this invention is capable of operating with very low overall voltage noise while employing an inexpensive operational amplifier second stage and while simultaneously having a high grain, narrow bandwidth characteristic.

It will be readily apparent to those skilled in this art from the detailed description and drawings that which is shown and described is only the preferred embodiment of the invention and the best mode contemplated for carrying out the invention. The invention, therefore, is capable of other and different embodiments, and its several details are capable of modifications in various obvious respects, all without departing from the invention. Accordingly, the drawings and description are to be regarded as illustrative in nature, and not as restrictive.

I claim:
1. A tuned, low noise amplifier comprising:

a first amplifying stage including a field effect transistor with gate, drain and source connections and having both signal input and signal output means;

a second amplifying stage driven by said first amplifying stage from said first stage signal output means and including an operational amplifier having inverting and non-inverting inputs and a second stage signal output means, said operational amplifier being loaded in a reactive impedance bridge configuration and said second stage reflecting a negative resistance in parallel with said first stage signal output means.

2. The amplifier of claim 1 wherein said bridge configuration is a Wien Bridge.

3. The amplifier of claim 2 wherein said Wien Bridge configuration load comprises a first resistance ($R_4$) connected between said second stage signal output means and said inverting input, a second resistance ($R_5$, $R_6$) network connected between said inverting input and ground, a shunt capacitance ($C_5$)—third resistance ($R_9$) network connected between said non-inverting input and ground and a series capacitance ($C_{14}$)—fourth resistance ($R_7$, $R_8$) network connected between said second stage signal output means and said non-inverting input.

4. The amplifier of claim 3 wherein the value of said first resistance ($R_4$) approaches twice the value of said second resistance ($R_5$, $R_6$).

5. The amplifier of claim 3 wherein said field effect transistor has a resistance load ($R_2$) connected to said drain connection.

6. The amplifier of claim 5 wherein said field effect resistance load at said drain connection ($R_2$) is approximately equal in magnitude to said fourth resistance ($R_7$, $R_8$).

7. The amplifier of claim 3 wherein said shunt capacitance ($C_5$) is approximately equal in value to said series capacitance ($C_4$).

8. The amplifier of claim 1 wherein said first stage signal output means is a resistive load ($R_2$).

9. The amplifier of claim 8 wherein said negative resistance is larger in magnitude than said resistive load.

10. The amplifier of claim 1 wherein said first stage drives said second stage at said non-inverting input of said operational amplifier.

* * * * *